United States Patent
van der Zee et al.

(10) Patent No.: US 10,931,232 B2
(45) Date of Patent: Feb. 23, 2021

(54) CRYSTAL OSCILLATOR CIRCUIT AND METHOD OF OPERATION

(71) Applicant: NXP B.V., Eindhoven (NL)

(72) Inventors: Ronan van der Zee, Enschede (NL); Joeri Lechevallier, Enschede (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/751,233

(22) Filed: Jan. 24, 2020

(65) Prior Publication Data
US 2020/0244220 A1    Jul. 30, 2020

(30) Foreign Application Priority Data
Jan. 24, 2019    (EP) ...................................... 19153629

(51) Int. Cl.
*H03B 5/04* (2006.01)
*H03B 5/36* (2006.01)

(52) U.S. Cl.
CPC .................. *H03B 5/04* (2013.01); *H03B 5/36* (2013.01)

(58) Field of Classification Search
CPC ........................................................ H03B 5/04
USPC ....................................................... 331/116 R
See application file for complete search history.

(56) References Cited

U.S. PATENT DOCUMENTS

| 6,819,195 | B1 | 11/2004 | Blanchard et al. | |
| 2016/0099677 | A1* | 4/2016 | Abbasi | H03B 5/36 331/158 |
| 2016/0373055 | A1 | 12/2016 | Kumar et al. | |
| 2018/0302034 | A1* | 10/2018 | Ding | H03B 5/06 |

OTHER PUBLICATIONS

Linear Technology, "60ns, Low Power, Single Supply, Ground-Sensing Comparator," LT1671 datasheet, downloaded at: https://www.analog.com/media/en/technical-documentation/data-sheets/1671fs.pdf, Oct. 29, 2019.
Chang, W., "An Energy-Efficient Self-Charged Crystal Oscillator with a Quadrature-Phase Shifter Technique", IEEE Asian Solid—State Circuits Conference, Nov. 6-8, 2017.
Ding, M., "5.3 A 95µW 24MHz digitally controlled crystal oscillator for IoT applications with 36nJ start-up energy and >13x start-up time reduction using a fully-autonomous dynamically-adjusted load", ISSCC 2017, Session 5, Analog Techniques, IEEE 2017.
Esmaeelzadeh, H., "A precisely-timed energy injection technique achieving 58/10/2µs start-up in 1.84/10/50MHz crystal oscillators", IEEE 2017.
Esmaeelzadeh, H., "A Quick Startup Technique for High-Q Oscillators Using Precisely Timed Energy Injection", IEEE Journal of Solid-State Circuits, vol. 53, No. 3, Mar. 2018.
Griffith, D., "5.9 A 24MHz crystal oscillator with robust fast start-up using dithered injection," ISSCC 2016., Session 5, Analog Techniques, pp. 104-105, IEEE 2016.

(Continued)

*Primary Examiner* — Joseph Chang (57) ABSTRACT

A crystal oscillator circuit (100, 200) is described that includes a crystal resonator (220); and a voltage source (204) configured to apply a voltage step across the crystal oscillator (220) where a polarity of the voltage source (204) applied to the crystal resonator (220) is switched in response to a sign of a current passing through the crystal resonator (220) and in response thereto a self-timed energy injection waveform is provided to the crystal resonator (220).

20 Claims, 7 Drawing Sheets

(56) References Cited

OTHER PUBLICATIONS

Iguchi, S., "Variation-Tolerant Quick-Start-Up CMOS Crystal Oscillator With Chirp Injection and Negative Resistance Booster", IEEE Journal of Solid-State Circuits, vol. 51, No. 2, Feb. 2016.

Lechevallier, J., "Fast & Energy Efficient Start-Up of Crystal Oscillators by Self-Timed Energy Injection", IEEE Journal of Solid-State Circuits, IEEE 2019.

Lei, K., "A 0.4V 4.8µW 16MHz CMOS crystal oscillator achieving 74-fold startup-time reduction using momentary detuning", IEEE 2017.

Lei, K., "A regulation-free sub-0.5V 16/24MHz crystal oscillator for energy-harvesting BLE radios with 14.2nJ startup energy and 31.8pW steady-state power", ISSCC 2018, Session 3, Analog Techniques, IEEE 2018.

\* cited by examiner

CRYSTAL OSCILLATOR CIRCUIT AND METHOD OF OPERATION

CROSS-REFERENCE TO RELATED APPLICATIONS

This application claims the priority under 35 U.S.C. § 119 of European Patent application no. 19153629.1, filed on 24 Jan 2019, the contents of which are incorporated by reference herein.

FIELD OF THE INVENTION

The field of the invention relates to a crystal oscillator and a method of operation therefor. In particular, the field of the invention relates to a crystal oscillator that provides a fast and efficient start-up.

BACKGROUND OF THE INVENTION

Low power wireless systems are on the rise, with applications in Internet of Things (IoT) such as Bluetooth Low Energy (BLE). Supply energy is usually scarce in these applications as power is often delivered by batteries or energy harvesting, necessitating techniques to achieve low power consumption. Duty cycling is one way to achieve low (average) power consumption. A duty cycled system spends most of the time in a low-power sleep mode, only briefly waking up to transmit or receive packets in an active mode. The transition from sleep mode to active mode requires starting up the radio circuit blocks, which take some time for settling. Most circuits, such as the low drop out regulator (LDO) and phase locked loop (PLL), settle quickly (e.g. in the ps range). However, the crystal oscillator that serves as a frequency reference conventionally starts up relatively slowly (e.g. in the msec. range). The start-up of this crystal oscillator not only dominates start-up time of the system but more importantly comes with a large energy consumption. The energy required just to start up the reference oscillator can be tens of percent's of the total system energy consumption, sufficiently compromising battery life.

A series (motional) branch that includes a resistor $R_m$, inductor $L_m$, and capacitor $C_m$ (RLC) is typically used to model a crystal oscillator, the fundamental resonance of which is also influenced by a parallel package parasitic capacitance $C_p$. During start-up, the current $I_m$ in the series branch grows from its initial value $I_m(0)$ to a sinusoid with steady-state amplitude ($\hat{I}_{m,SS}$). Conventionally, the oscillation is started and sustained by an active circuit, which provides a negative resistance ($R_N$). Since the initial condition is typically very small (noise), and the magnitude of the negative resistance is quite small, start-up is typically a lengthy and inefficient process. Recent literature has presented solutions that improve the start-up time and/or energy consumption by injecting energy into the crystal before settling to the steady state and/or increasing the magnitude of the negative resistance during start-up, The magnitude of the negative resistance can be boosted by increasing the transimpedance gm and/or decreasing the load capacitance $C_{load}$. However, the maximum negative resistance, and hence minimum start-up time, is limited by $C_p$. In some instances, this limitation can be overcome by making the active circuit appear slightly inductive to (partially) cancel $C_p$. Although this solution is among the most energy-efficient in the literature, the start-up time is still relatively long, as perfect cancellation of $C_p$ over power, voltage, temperature (PVT) variations across the circuit is difficult.

Energy injection can be achieved by connecting an injection oscillator to the crystal. to inject energy at the frequency of the crystal, which unfortunately requires a significant amount of energy during start-up.

SUMMARY OF THE INVENTION

The present invention provides a crystal oscillator and a method of operation therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Known crystal oscillators take a relatively long time, and more importantly a significant amount of energy, to start-up. In accordance with some example embodiments of the present invention, an approach that uses self-timed energy injection technique to quickly start-up a crystal oscillator, for very low energy consumption, is described. This is achieved by realizing that the injection waveform ideally switches polarity at each zero-crossing of the current, e.g. the motional current of the crystal oscillator. Instead of relying on a separate injection oscillator to generate the timing, the zero crossings of the motional current in example embodiments of the invention are directly detected in order to generate a self-timed injection waveform signal. In this manner, the proposed self-timed energy injection technique is used to quickly start-up a crystal oscillator, which is particularly advantageous to provide very low energy consumption oscillations. Advantageously, this quick start-up is also achieved without a power-hungry separate oscillator to provide the injection signal.

Although examples of the invention are described with reference to a crystal oscillator (or crystal resonator), it is envisaged that some examples of the invention may be applied to other types of resonators, such as Micro-Electro-Mechanical Systems (MEMS) resonators, LC resonators, etc.

Although examples of the invention are described with reference to a self-timed energy injection circuit, used as a mechanism to quickly start-up a crystal oscillator, and thereafter switch to a known steady-state oscillator circuit, it is envisaged that some examples of the invention may be applied purely to sustain oscillation in a crystal oscillator. In the typical use case, the proposed circuit supplies more energy to the crystal oscillator than is lost, such that the oscillation grows. If the circuit would not be disabled, the motional current amplitude will saturate at the point where the crystal oscillator losses are equal to the injected energy. Alternatively, in some examples, a mechanism can be built-in to reduce the injected energy after start-up, such that the oscillation stops growing, for example reducing the switch duty cycle, or reducing the supply voltage to achieve this.

The inventors of the present invention have recognised and appreciated that a major challenge in energy injection techniques is the accuracy of the injection oscillator. In order to be effective, the injection signal should be in phase with the current waveform over the entire injection time. Since the start-up takes at least hundred(s) of clock periods, this places severe requirements on the frequency accuracy of the injection oscillator, i.e. better than 0.5%, over PVT variations. To achieve the required accuracy, the known prior art crystal oscillators have resorted to measures, such as calibration, chirping or dithering. Calibration attempts to exactly track the crystal frequency are power consuming and difficult to ensure over PVT. Chirping and dithering spread the energy over a frequency band, such that there is always an amount of energy injected in the crystal, even with frequency uncertainty due to PVT variations. Nevertheless, the energy injection only injects a small amount of energy into the crystal, such that it still takes a long time to reach the steady state amplitude. A solution to this is to precisely time the injection duration ($T_{injection}$), to inject the amount of energy into the crystal that is required to reach the steady state amplitude. This known technique speeds up the start-up process, but still requires a power hungry injection oscillator that requires frequency tuning to the specific crystal.

In accordance with some example embodiments of the present invention, there is provided a crystal oscillator circuit that includes a crystal oscillator and a voltage source configured to apply a voltage step across the crystal oscillator where a polarity of the voltage source applied to the crystal oscillator is switched in response to a sign of a current passing through the crystal oscillator and provides a self-timed energy injection waveform to the crystal oscillator.

Figure 1:
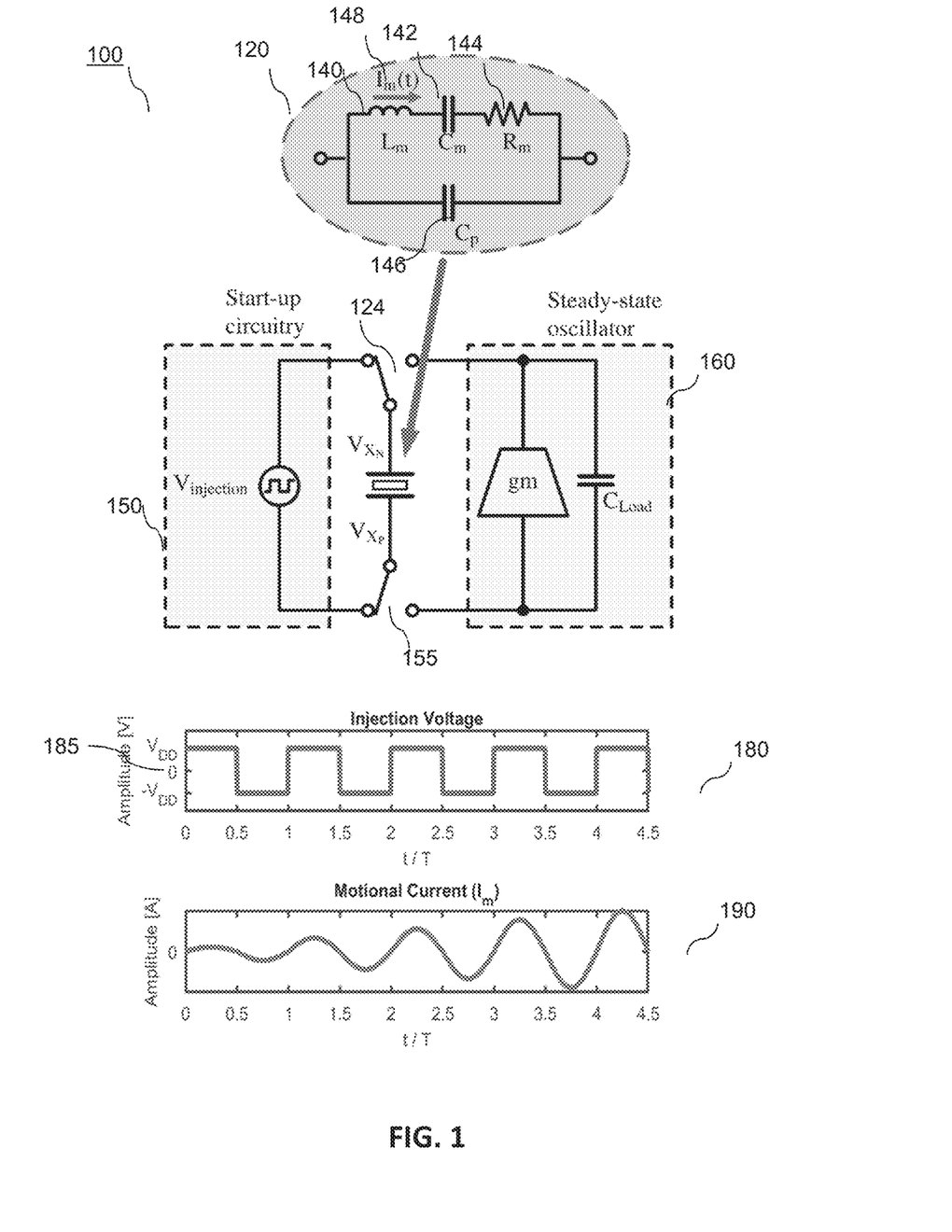
FIG. 1 schematically illustrates a block diagram of a crystal oscillator design with a self-timed energy injection circuit and example input energy injection waveforms according to an example of the present invention.

Referring now to FIG. 1, a schematic block diagram of a crystal oscillator design 100 with a generic self-timed energy injection (start-up) circuit 150 is illustrated according to an example of the present invention. The schematic block diagram of a crystal oscillator design 100 also includes example input energy injection waveforms. A crystal resonator 120 is represented by a resistance 144, inductance 140, capacitance 142 (RLC) circuit, with a motional current 148 passing there through, located in parallel to a parasitic capacitance 146.

In accordance with examples of the invention, the crystal oscillator design 100 includes a start-up circuit 150 that is connected to the crystal resonator 120 for a certain period of time. During this time, the injection voltage 180 is alternating its polarity, around a zero crossing point 185, thereby increasing the motional current amplitude 190 over time. After the injection time provided by the start-up circuit 150 has sufficiently speeded up the oscillations of the crystal oscillator, the crystal is then connected to the steady-state oscillator circuit 160, which sustains the oscillation.

In some examples, in principle, the proposed start-up circuit 150 may also be used as steady-state oscillator 160. Here, in this example, the start-up circuit 150 would also be used as the steady-state oscillator 160, and there would indeed be no switching from 'start-up circuit 150' to 'steady-state circuit 160'. However, the H-bridge switches, in some examples described hereafter, would still be switching.

FIG. 1 also shows an example of a square-wave injection waveform 180 and the resulting growing oscillations in the motional current $\hat{I}_m$ 190. Provided that the crystal quality factor is high ($R_m$ is small), the motional current $\hat{I}_m$ 190 can be calculated to increase linearly over time with a slope of:

$$\frac{A}{2L_m},$$

where A is the amplitude of the fundamental of the injection waveform. Advantageously, it is noted that the start-up slope is not dependent on the parasitic capacitance $C_p$ 146, as opposed to negative-resistance based circuits.

The known prior art crystal oscillator circuits resort to a use of separate injection oscillators in order to generate an injection waveform for the crystal oscillator. In accordance with examples of the invention, it is envisaged that any circuit implementation of a source that places a voltage step over a crystal oscillator, whereby a polarity of a voltage source applied to a crystal oscillator is switched in response to a sign of a current passing through the crystal oscillator and can be used to provide the proposed self-timed energy injection waveform to the crystal oscillator.

Figure 2:
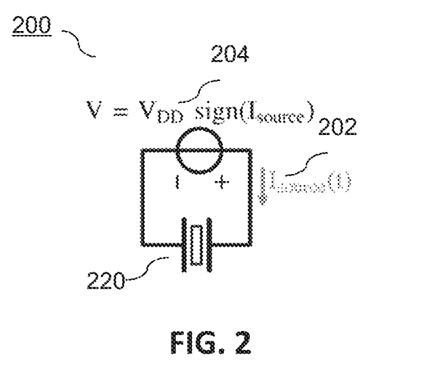
FIG. 2 schematically illustrates a simplified diagram of a crystal oscillator, according to some examples of the present invention.

Referring now to FIG. 2, a simplified diagram of a crystal resonator 200 illustrates a self-timed energy injection technique according to examples of the invention, As illustrated, any voltage source 204 used to drive crystal resonator 200, of which the polarity depends on the sign of the current passing through it, may be used as an injection waveform applied to the crystal resonator 200, where the injection waveform can be switched based on a sign of the current 202 passing through the crystal resonator 220. Since the injection waveform is self-timed, the signal frequency of the injection waveform automatically matches the crystal frequency. Advantageously, in examples of the invention, the voltage and current waveforms are similar to prior art waveforms, but without a need to resort to separate injection oscillators to create said waveforms.

The proposed self-timed energy injection relies on measurement of the motional current $I_m$. It is, however, impossible to directly measure $I_m$, since the motional branch is in parallel with $C_p$; any current measured at the crystal oscillator terminals could flow in either the motional branch or $C_p$. In some examples of the invention, this limitation can be overcome by ensuring that no current flows in the parasitic capacitance $C_p$ branch, such that the current measured at the crystal oscillator terminals can only flow through the motional branch. In some examples of the invention, this is achieved by applying (quasi-) constant voltages to the crystal oscillator (for example 'quasi-' as they are not constant, the voltages are still switching (in the same way as in FIG. 1), say by connecting it in an H-bridge, as shown in FIG. 3.

Figure 3:
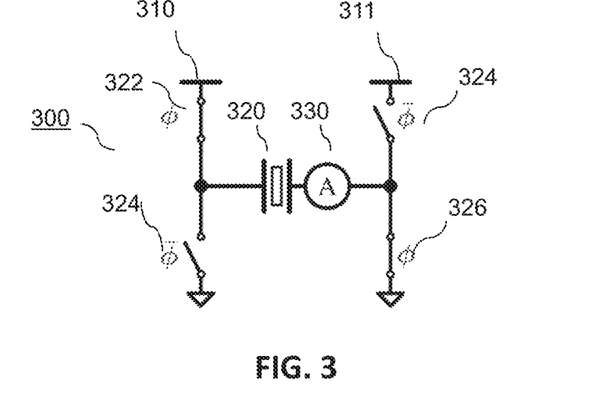
FIG. 3 schematically illustrates a first example block diagram of a crystal oscillator design with a H-bridge self-timed energy injection circuit, according to some examples of the present invention.

FIG. 3 schematically illustrates a first example block diagram of a crystal oscillator design 300 with a H-bridge self-timed energy injection circuit, according to some examples of the present invention. For a zero switch resistance, the voltage over the crystal resonator 320 settles immediately to $+V_{DD}$ or $-V_{DD}$, respectively. This means that the rate of change of voltage across the crystal oscillator $$\frac{dV_{C_p}}{dt} = 0,$$

meaning that $I_{C_p}=0$, and hence all current $I_m$ flows through the low-impedance (motional) path to the supply voltage.

Thus, in accordance with examples of the invention the motional current measurement may be performed by exploiting the non-zero on-resistance of practical switches. The voltage over a switch in an 'on' state is a measure of the current flowing through it. In this manner, the switch current therefore accurately indicates the zero-crossing points of the motional current $I_m$.

In this example of FIG. 3, a current flowing through the switches is measured by respective ammeter 330. The H-bridge self-timed energy injection applies a positive or negative voltage to the crystal resonator 320, depending on the switch phases φ and $\overline{\varphi}$. A generic current meter measures the current through the crystal resonator 320, and based on this input, switches the H-bridge to open or close alternating arms 310, 311.

Figure 4:
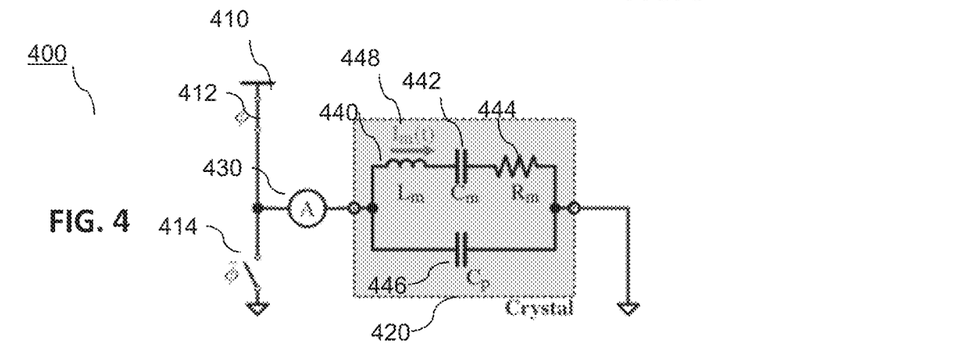
FIG. 4 schematically illustrates a block diagram of a crystal oscillator design with a single-ended self-timed energy injection circuit according to an example of the present invention.

FIG. 4 schematically illustrates a block diagram of an alternative crystal oscillator design 400 with a single-ended self-timed energy injection circuit, according to an example of the present invention. A crystal resonator 420 is again represented by a resistance 444, inductance 440, capacitance 442 (RLC) arrangement, with a motional current 448 passing there through, in parallel to a parasitic capacitance 446. The single-ended self-timed energy injection circuit includes two switches 412, 426 on arm 410. In this example, a current flowing through the switches is measured by respective ammeter 430.

Figure 5:
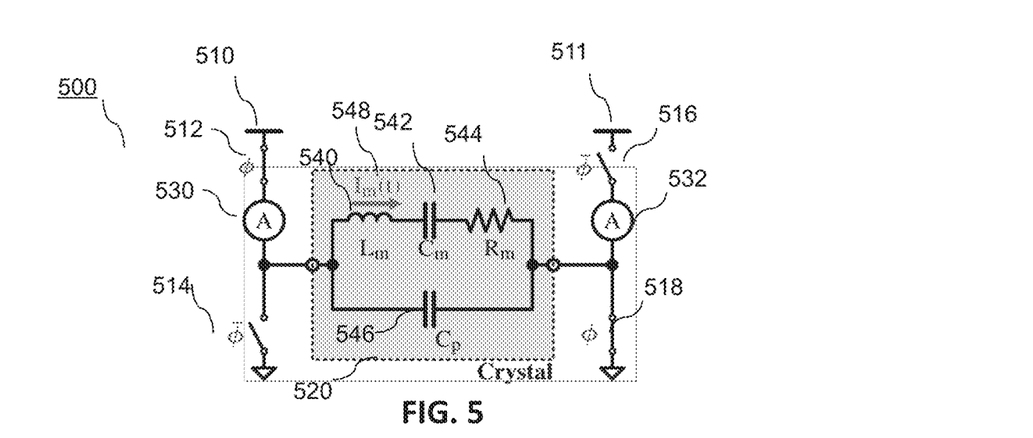
FIG. 5 schematically illustrates a second example block diagram of a crystal oscillator design with a H-bridge self-timed energy injection circuit, according to some examples of the present invention.

FIG. 5 schematically illustrates a second example block diagram of a crystal oscillator design 500 with a H-bridge self-timed energy injection circuit, according to examples of the present invention. A crystal resonator 520 is again represented by a resistance 544, inductance 540, capacitance 542 (RLC) arrangement, with a motional current 548 passing there through, in parallel to a parasitic capacitance 546. The H-bridge 510, 511 includes two switches per arm, i.e. switches 514, 518 to ground whilst switches 512, 516 are connected to the supply. In this example, a current flowing through the switches is measured by respective ammeter 530 532.

Figure 6:
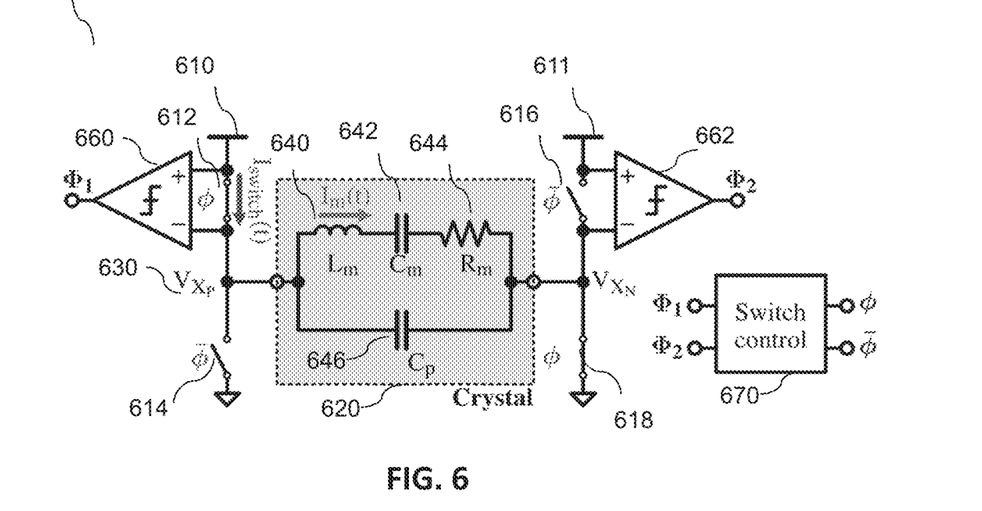
FIG. 6 schematically illustrates a third example block diagram of a crystal oscillator design with a H-bridge self-timed energy injection circuit using comparators, according to some examples of the present invention.

FIG. 6 schematically illustrates a third example block diagram 600 of a crystal oscillator circuit 620 with a H-bridge self-timed energy injection implementation using comparators 660, 662, according to examples of the present invention. The H-bridge includes two switches per arm 610, 611, whereby the switches 614, 618 to ground are low-ohmic, whilst the switches 612, 616 to the supply are configured to be relatively high-ohmic, in order to increase the current detection sensitivity. In some examples, low ohmic switches are well below 1K ohm, for example in tens of ohms. Using switches with non-zero resistance, the voltage over them provides a measure of the current. Therefore, by sensing the voltage over the switches that have a non-zero resistance, a direct measurement of the current can be achieved.

Figure 8:
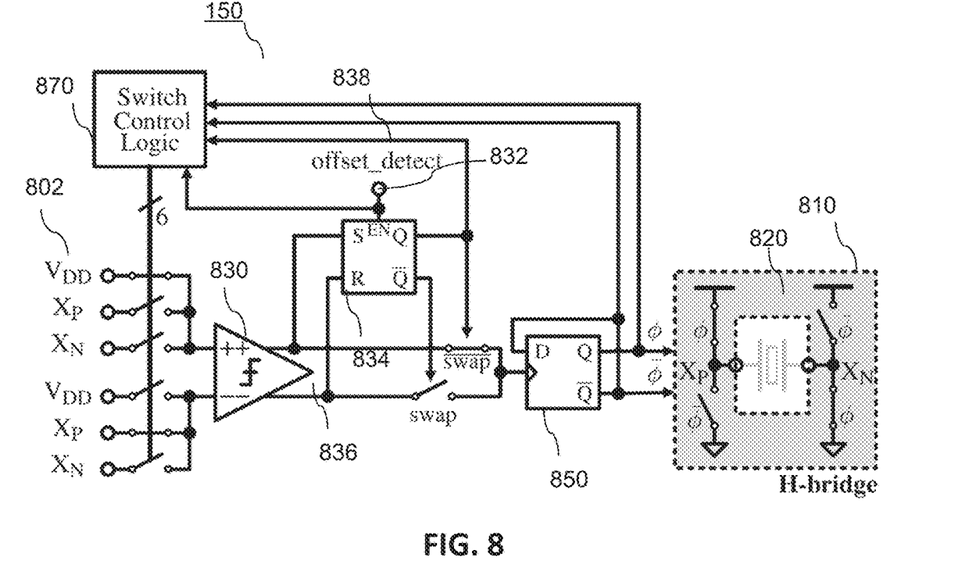
FIG. 8 illustrates a start-up circuit block diagram, in accordance with some examples of the invention.

Furthermore, only the sign of the current is sufficient for the control of the switch phases. Therefore, whilst only the comparator that is connected to the switch that is 'on' is active, the particular comparator 660, 662 is sufficient for this sensing operation and is thereby configured to determine a direction of the respective current through switch pairs 612, 614 or 616, 618. If the output of that comparator toggles, its input voltage changes sign, meaning that $I_m$, has reversed direction. The switch control circuit 670 determines which comparator is 'active' and controls the H-bridge accordingly, by toggling the switches 612, 614, 616, 618, and waits until the next zero crossing is detected, resulting in current and voltage waveforms similar to FIG. 1. For example, when the start-up circuit is enabled, a D-type flip-flop (as illustrated in FIG. 8) toggles every time the comparator detects a zero-crossing. This in turn toggles the H-bridge switches, as well as the comparator inputs. This process is repeated until the start-up circuit is disabled.

Figure 7:
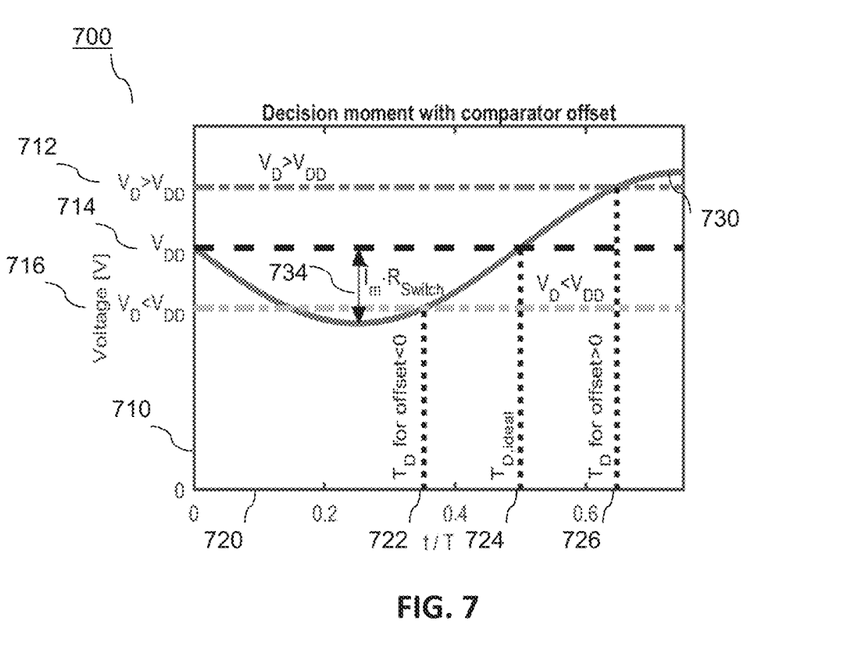
FIG. 7 illustrates an example voltage waveform to illustrate a decision moment variation over comparator offset, in accordance with some examples of the invention.

Any comparator offset influences the decision moment. Referring now to FIG. 7, a graph 700 of an example voltage waveform 730 illustrates a decision moment variation over comparator offset. The example voltage waveform 730 is illustrated with respect to voltage 710 versus time 720, with a zero crossing voltage VDD identified at 714. Dependent upon the comparator offset a decision may be taken early or late, with respect to an ideal sampling point, as illustrated in FIG. 7. If the voltage offset is positive, e.g. at 712, the comparator decision is slightly late at 726, whilst for a negative offset, e.g. at 716, the decision is taken slightly early, e.g. at 722, which ensures a reliable start-up. In some instances, the decision is delayed with respect to the ideal decision moment at time 724, for example due to charging of (parasitic) capacitances and comparator delay. Too much delay slows down the start-up process or can even dampen the oscillation. If the offset is too large, the decision threshold is never reached, such that the circuit will not oscillate.

Therefore, in some examples of the invention, a sign of the comparator(s), such as comparators 660, 662 of FIG. 6, a current offset is detected at the beginning of the start-up phase, and is used to swap the comparator inputs and invert the output, as required, such that the offset is always negative. Thus, in this manner, the thresholds of the comparator circuit may be configured to ensure that the voltage decision threshold of each comparator is always below $V_{DD}$ 714, and determined by Im*$R_{switch}$ 734. It is noteworthy that if the negative offset would be too large, a relaxation oscillator is formed, with a time constant determined by $R_{switch}$ and $C_{tot}$. In a case whereby this relaxation oscillation is encountered, some energy is injected into the crystal resonator, such that after a short time the circuit continues to oscillate at the crystal frequency. Thus, in some examples of the invention, the crystal oscillator circuit design may be configured to ensure that the offset is sufficiently small to prevent this behaviour, by appropriate control/setting of the comparator thresholds.

Referring now to FIG. 8, one example of a start-up circuit 150 is illustrated, in accordance with some examples of the invention. In accordance with the H-bridge examples illustrated in FIG. 6, only one comparator is active at any instant in time. In this example, a single, shared comparator 830 is illustrated with a switch matrix 802 that is controlled by the switch control circuit 870 in order to connect the appropriate comparator inputs at the correct time. During the offset detection phase, the comparator inputs are connected to the supply in order to detect a sign of the comparator offset voltage, monitored by the respective comparator. The result is stored in a latch, such as S-R latch 834, which controls the swapping of the comparator inputs and outputs as necessary via the switch control circuit 870.

When the start-up circuit 150 is enabled, the D-type flip-flop 850 is configured to toggle each time that the comparator 830 detects a zero-crossing. In turn, the D-type flip-flop 850 toggles the switches of the H-bridge 810 connected to the crystal resonator 820, as well as the inputs to the comparator 830. This process is repeated until the start-up circuit 150 is disabled. For example, during say the first 80 nsec of each start-up cycle, a comparator offset sign detection circuit 832 is enabled by the switch control circuit 870. During this phase, both comparator inputs are connected $V_{DD}$. The comparator output 836, which indicates a sign of the offset, is stored in SR-latch 834. This serves as an input 838 for the switch control circuit 870, which swaps the comparator inputs and output when necessary, in order to ensure that the decision threshold is always below $V_{DD}$. In this manner, the effect of delays in a decision on when to switch the voltage source, due to comparator offsets, is reduced or negated.

Figure 9:
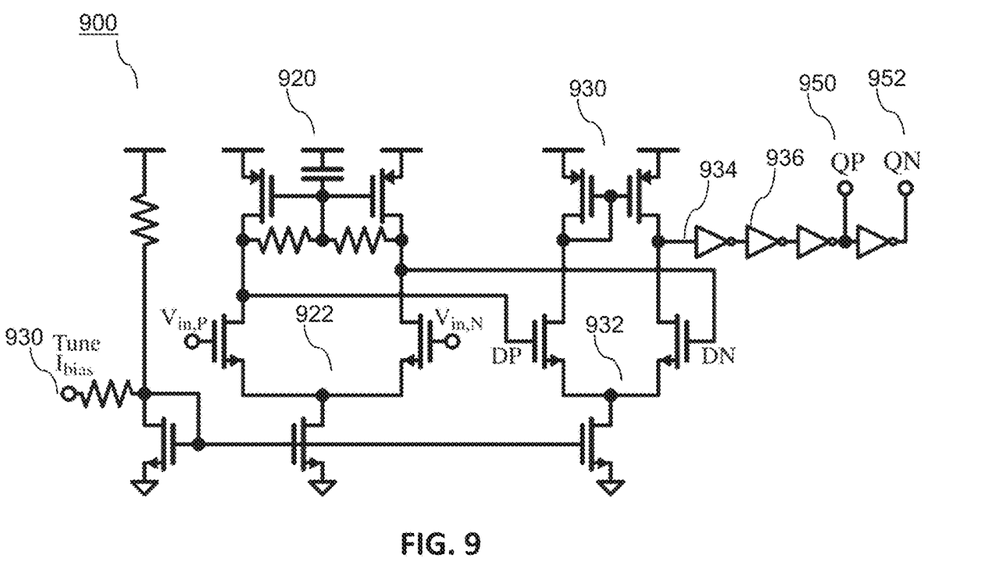
FIG. 9 illustrates a schematic of a comparator circuit, in accordance with some examples of the invention.

Referring now to FIG. 9 one example schematic of a comparator circuit 900 is illustrated, in accordance with some examples of the invention. In this example, the comparator circuit 900 is a static comparator and implemented as a continuous-time (limiting) amplifier. However, it is envisaged that in other examples the comparator may be any comparator, e.g. static or dynamic. A first differential pair 920 is configured large in order to minimize mismatch (e.g. random fluctuations in device properties), which cause offset, and is connected to a symmetric active load 922, 932. A second differential stage 930 increases the gain and converts to a single-ended output 934, which is amplified by cascaded inverters 936 in order to generate rail-to-rail (QP to QN) outputs 950, 952. To accommodate various crystals, in this example, a bias current is tunable via a fine tuning input 912.

Figure 10:
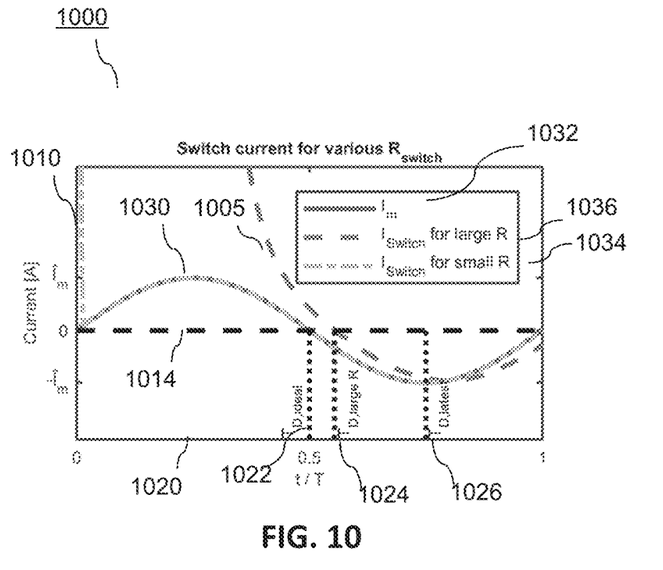
FIG. 10 illustrates waveforms of switch current for various non-zero switch resistances, in accordance with some examples of the invention.

Referring now to FIG. 10, a graph 1000 of switch current for various non-zero switch resistances is illustrated, in accordance with some examples of the invention. The graph 1000 is illustrated with respect to current 1010 versus time 1020 across a current cycle, with a zero crossing current identified at 1014. The motional current 1132, together with the switch current for small resistances 1034, follow the same path 1030.

A high switch resistance is desired in order to maximize current detection sensitivity. Thus, ideally, the comparator detects the zero crossing of $I_m(t)$ 1032 occurring at $$t = \frac{T}{2}$$

1022 The actual decision is taken when $I_{switch}=0$, which is later 1024 than $$t = \frac{T}{2}$$

and the delay is dependent upon the switch resistance, as illustrated in FIG. 10. Furthermore, comparator delay further increases the time between the ideal switching time and the actual switch time. The latest point in time 1026 at which the injection waveform may switch is 90 degrees $$\left(\frac{T}{4}\right)$$

out of phase with $I_m$ 1032, as otherwise the oscillation would be damped instead of amplified. For a comparator delay $T_{D,comp}$, this means that that $I_{switch}$ (¾T−$T_{D,comp}$)<0.

Note that comparator delay $T_{D,comp}$ is, in practice, amplitude-dependent, and the motional current $\hat{I}_m(t)$ is time-dependent. However, the first cycle is most critical, since the motional current is at its smallest. Following each cycle, the amplitude of the motional current $I_m$ grows and the specifications on comparator and switch resistance become more relaxed. To maximize the initial current, a 'single kick' may be given to the crystal by applying a voltage step equal to the supply. The initial current amplitude after this 'single kick' may be calculated as $$\hat{I}_m(0) = V_{DD}\sqrt{\frac{C_m}{L_m}},$$

which is in the range of 150 nA-2 uA for typical crystal oscillators ranging between 16-50 MHz.

Figure 11:
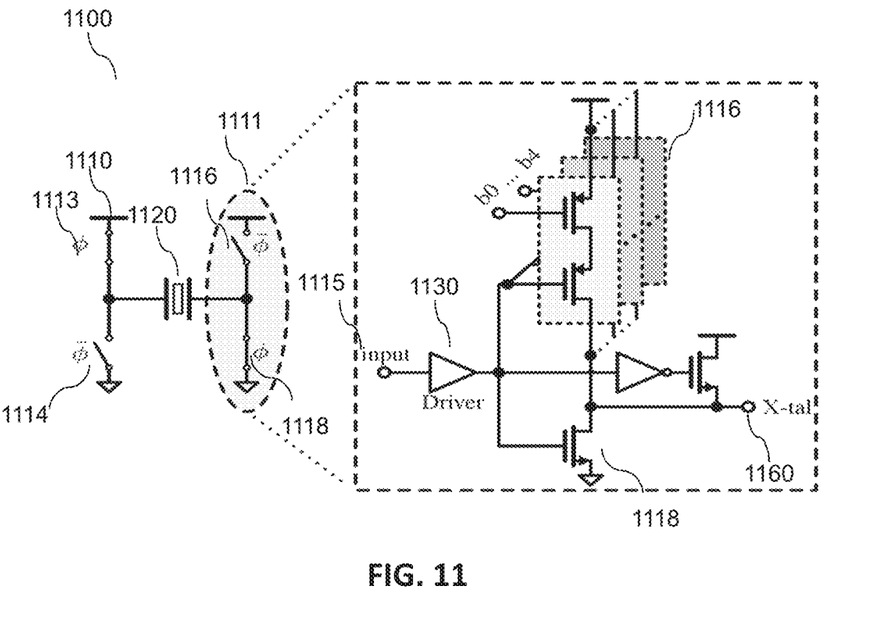
FIG. 11 illustrates a circuit schematic of a H-bridge circuit block diagram, in accordance with some examples of the invention.

Referring now to FIG. 11 an example schematic of a H-bridge circuit 1100 is illustrated, in accordance with some examples of the invention. Each half of the H-bridge circuit 1100 is implemented by complementary PMOS and NMOS transistors, driven by the driver amplifier 1130. In the example H-bridge circuit 1100, a low-ohmic path to ground is provided by large NMOS switches 1114, 1118. The PMOS switches 1113, 1116 connected to the supply are configured to act as measurement resistors. In this example, the PMOS switches 1113, 1116 are binary scalable/tunable switches, configured to be scalable/tunable over a range of, say, approximately 80Ω to 1.3 kΩ, in order to tune its resistance, and thereby accommodate various crystals having different requirements on settling time and detection sensitivity. Self-quenching NMOS switches 1150 are connected in parallel to the PMOS switches to quickly pull-up the respective crystal nodes to $V_{DD}$-$V_{TH,N}$ after a switch event. This allows a reduction in settling time, by approximately one third, whilst retaining the PMOS switch resistance for current detection sensitivity. A high PMOS switch resistance is desired to achieve a good current detection sensitivity, on the other hand, a low switch resistance is desired, since a high switch resistance causes the crystal voltages to only rise slowly (due to the RC-time constant). By putting a self-quenching (opening) switch in parallel, the resistance is temporarily lower, allowing for a faster charging of the crystal voltages without compromising on current detection sensitivity.

Figure 12:
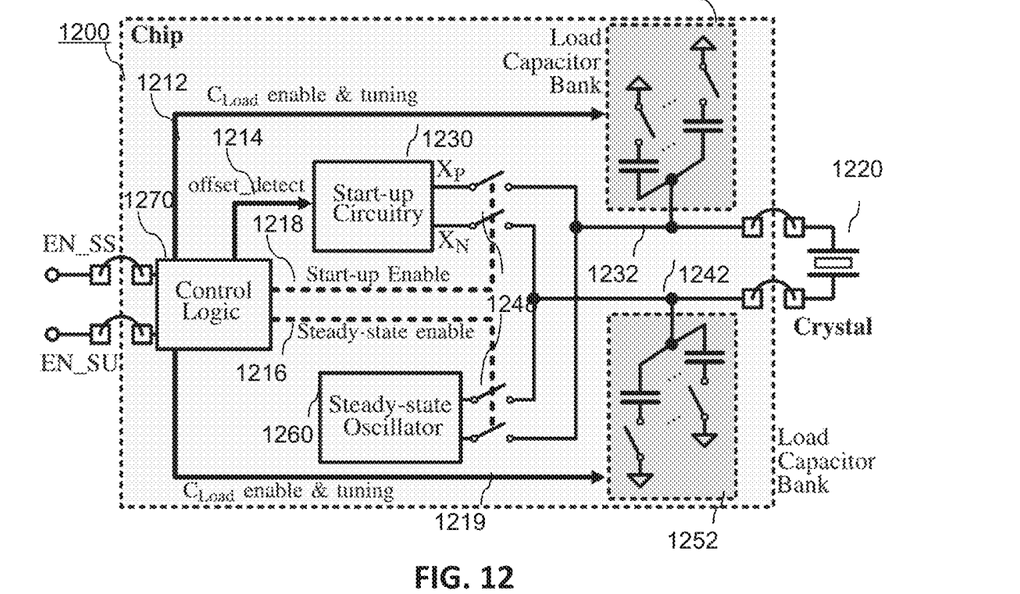
FIG. 12 illustrates an integrated circuit with a start-up circuit and a steady-state oscillator circuit and a load capacitor bank, in accordance with some examples of the invention.

Referring now to FIG. 12, an integrated circuit 1200 with a start-up circuit and a steady-state oscillator circuit and a binary tunable load capacitor bank, coupleable to a crystal resonator circuit, is illustrated in accordance with examples of the invention. Although this example illustrates an integrated circuit 1200 with a binary tunable load capacitor bank, it is envisaged that in other examples other tunable resonance circuits can be used.

In this example, a control circuit 1270 is configured to enable the appropriate circuits (or circuit components) for either a start-up mode of operation 1218 or a steady-state mode of operation 1216 and switch operation there between. During a start-up mode of operation, an offset detection circuit is briefly enabled and an offset signal 1214 detected and output by the control circuit 1270, after which the start-up circuit 1230 starts injecting energy via paths 1232, 1242 into the external crystal resonator 1220. The load capacitor bank 1250, 1252 is disconnected during the start-up mode of operation in order to minimize $CV^2$ losses. After a pre-determined (preferably externally controlled or self-controlled) start-up time, the start-up control signal 1218 disables the start-up circuit 1230. Note that the injection duration may be externally controlled. An (inaccurate) clock is however immediately available at the comparator output, which can be used to self-time the start-up circuit, e.g. by counting the number of cycles.

Thereafter, the steady-state oscillator 1252 is then enabled by control circuit 1270 by opening and closing the appropriate switches 1248 via steady-state enable signal 1216. Substantially concurrently, control circuit 1270 enables and tunes the load capacitor banks 1250, 1252, which consists, say, of 1 pF unit elements, via signals 1212, 1219.

Figure 13:
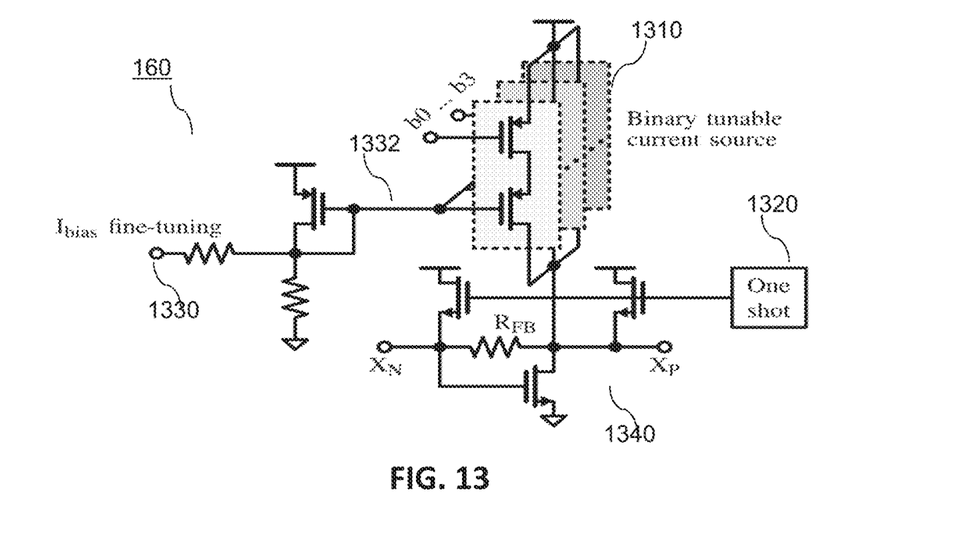
FIG. 13 illustrates a circuit schematic of a steady state oscillator circuit, in accordance with some examples of the invention.

Referring now to FIG. 13 a schematic of a steady state oscillator circuit 160, such as steady state oscillator circuits 160 in FIG. 1 or 1260 in FIG. 12, is illustrated, in accordance with some examples of the invention. In this example, the illustrated steady-state oscillator circuit 160 is a simple self-biased NMOS stage, although other known steady-state oscillator designs may be employed in other examples. To accommodate various crystals, in this example, the bias current 1332 is tunable via a fine tuning input 1330. In this manner, various bias currents may be employed to accommodate various crystals and output amplitudes. In this example, a series of binary switches 1310 is used to allow coarse tuning, whilst analog fine-tuning is possible through tuning input 1330, for example via an external pin. In this example, the 'so-called' self-quenched NMOS circuit 1340 is triggered by a delay circuit 1320, such as a delay-line operating as a one-shot. A delay-line operating as a one-shot briefly enables the NMOS transistors, which charge the load capacitor voltages to Vdd-Vth. This reduces the settling time of the circuit by pulling the load capacitor voltages to $V_{dd}$-$V_{th}$ and to reduce a settling time of the steady-state oscillator 160 during a transition from a start-up phase to a steady-state phase.

Figure 14:
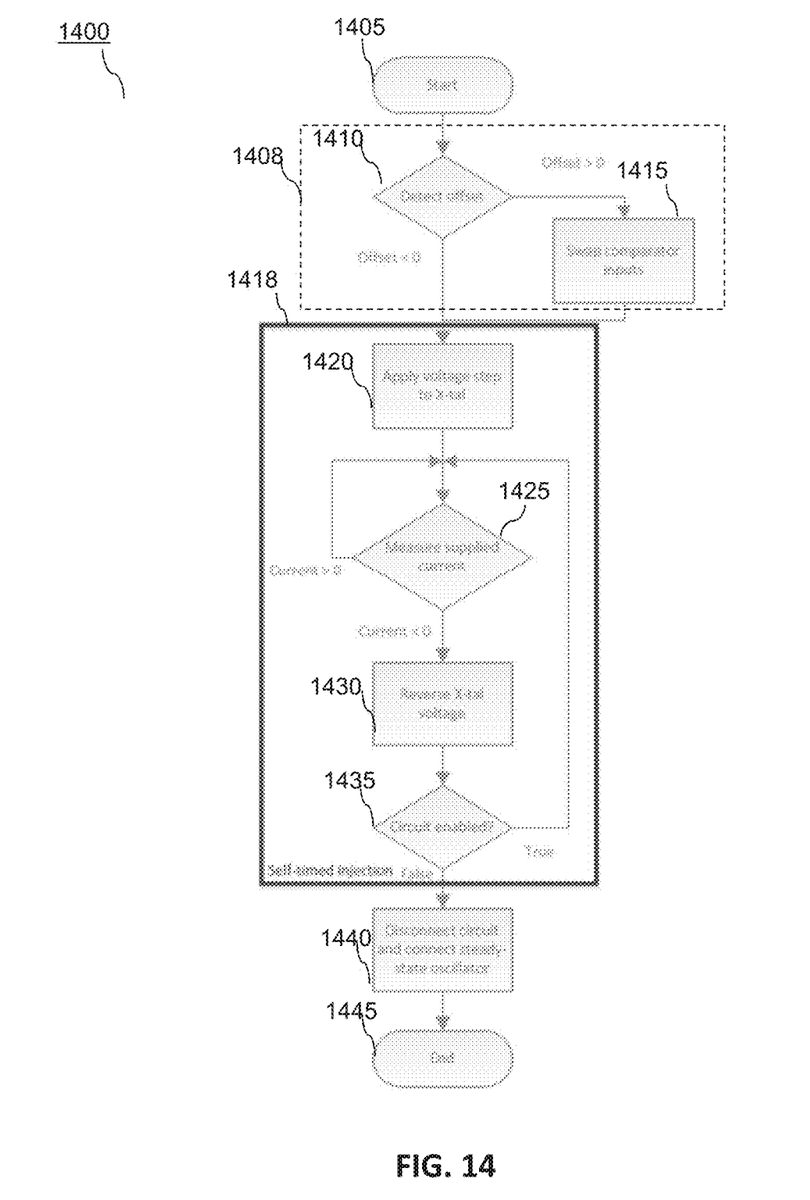
FIG. 14 illustrates a first flowchart of an example self-timed energy injection method, in accordance with some examples of the invention.

Referring now to FIG. 14, a first flowchart 1400 illustrates an example of a self-timed energy injection of a crystal oscillator operation, in accordance with some examples of the invention. The example of a self-timed energy injection of a crystal oscillator enables quick and energy efficient start-up of crystal oscillators. This is achieved by detecting the zero crossings of a motional branch current of the crystal oscillator, and using this information to switch the voltage over the crystal oscillator. Since the injection waveform is self-timed, as illustrated in FIG. 1, the injection frequency automatically matches the crystal frequency. This allows accurate energy injection, without the need for power hungry frequency injection oscillators or calibration steps.

The first flowchart 1400 starts at 1405 and a new offset detection approach is adopted at 1408 including detecting a comparator offset voltage at 1410. If the comparator offset voltage is determined as being >0, the comparator inputs may be swapped at 1415, for example the comparator inputs 312, 318 switched to comparator inputs 314, 316 in FIG. 3. The flowchart then moves to 1420. If it is determined that an offset is ≤0 at 1410, the flowchart then moves to 1420. In accordance with example embodiments of the invention, a new self-timed injection operation is employed at 1418, encompassing operations 1420-1435. At 1420, a voltage step is applied to a crystal oscillator and at 1425 the supplied current is measured, for example using any of the aforementioned approaches. If the measured supplied current is ≥0, then the flowchart loops. If the measured supplied current at 1425 is <0, then the voltage applied to the crystal oscillator is reversed at 1430. A determination is then made as to whether the crystal oscillator circuit is enabled at 1435. If the crystal oscillator circuit is enabled at 1435, the flowchart loops back to 1425 and the supplied current measured again. If the crystal oscillator circuit is not enabled at 1435, the self-timed injection circuit is disconnected and a steady-state oscillator connected at 1440 and the flowchart ends at 1445.

Thus, in this manner and after comparator offset voltage detection, a first voltage step is applied to the crystal and the resulting current is measured. When the current reverses direction, the crystal voltage is switched, repeating the process until the start-up circuit is disabled.

A skilled artisan will appreciate that the level of integration of circuits or components may be, in some instances, implementation-dependent.

Some example embodiments of the present application provide a method of starting up a crystal oscillator using a self-timed injection waveform that may be readily implemented on known crystal oscillator designs.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. In particular, examples of the invention describe an integrated circuit with a crystal oscillator, e.g. a 50 MHz crystal that is capable of achieving a start-up time of 6 us, for an energy consumption of just 3.5 nJ.

Furthermore, because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner, Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, examples of the invention are not limited to units implemented in non-programmable hardware but can also be applied in wireless programmable devices or units able to perform the desired device functions by operating in accordance with suitable program code, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A crystal oscillator circuit comprising:
   a crystal resonator;
   a voltage source configured to apply a voltage step across the crystal resonator where a polarity of the voltage source applied to the crystal resonator is switched in response to a sign of a current passing through the crystal resonator and in response thereto a self-timed energy injection waveform is applied to the crystal resonator;
   wherein the injection waveform switches polarity at each zero-crossing of a motional branch current of the crystal resonator.

2. The crystal oscillator circuit of claim 1, wherein the crystal resonator is initially coupled to a start-up oscillator circuit comprising the voltage source configured to start oscillations by the crystal resonator and thereafter switchably coupled to a steady state oscillator circuit.

3. The crystal oscillator circuit of claim 1, wherein the voltage source generating the self-timed energy injection waveform is coupled to a switch control circuit and a plurality of switches controlled by the switch control circuit to switch the polarity of the voltage source is formed in one of: a H bridge circuit; a single ended.

4. A crystal oscillator circuit comprising:
   a crystal resonator;
   a voltage source configured to apply a voltage step across the crystal resonator where a polarity of the voltage source applied to the crystal resonator is switched in response to a sign of a current passing through the crystal resonator and in response thereto a self-timed energy injection waveform is applied to the crystal resonator;
   wherein the crystal resonator is initially coupled to a start-up oscillator circuit comprising the voltage source configured to start oscillations by the crystal resonator and thereafter switchably coupled to a steady state oscillator circuit.

5. The crystal oscillator circuit of claim 4, wherein the injection waveform switches polarity at each zero-crossing of a motional branch current of the crystal resonator.

6. The crystal oscillator circuit of claim 4 wherein the crystal oscillator is coupled to at least one load capacitor and the steady state oscillator circuit 1300 comprises at least one self-quenched NMOS transistor coupled to a delay circuit configured to pull down a voltage across the at least one load capacitor.

7. The crystal oscillator circuit of claim 6, wherein the voltage source generating the self-timed energy injection waveform is coupled to a switch control circuit and a plurality of switches controlled by the switch control circuit to switch the polarity of the voltage source is formed in one of: a H bridge circuit; a single ended.

8. The crystal oscillator circuit of claim 4, wherein the voltage source generating the self-timed energy injection waveform is coupled to a switch control circuit and a plurality of switches controlled by the switch control circuit to switch the polarity of the voltage source is formed in one of: a H bridge circuit; a single ended.

9. A crystal oscillator circuit comprising:
a crystal resonator;
a voltage source configured to apply a voltage step across the crystal resonator where a polarity of the voltage source applied to the crystal resonator is switched in response to a sign of a current passing through the crystal resonator and in response thereto a self-timed energy injection waveform is applied to the crystal resonator;
wherein the voltage source generating the self-timed energy injection waveform is coupled to a switch control circuit and a plurality of switches controlled by the switch control circuit to switch the polarity of the voltage source is formed in one of: a H bridge circuit; a single ended.

10. The crystal oscillator circuit of claim 9 wherein each respective switch of the plurality of switches of the H bridge circuit that is coupled to a power source is connected across a comparator and configured to be activated in an alternating manner in response to a control signal from the switch control circuit.

11. The crystal oscillator circuit of claim 10, wherein a sign of the comparator(s) is detected at a beginning of a start-up phase, and is used to swap the comparator inputs and invert the output, such that a compactor voltage offset is always negative.

12. The crystal oscillator circuit of claim 10, wherein the comparator is a single, shared comparator with a switch matrix of inputs that is controlled by the switch control circuit.

13. The crystal oscillator circuit of claim 10 wherein each respective switch of the plurality of switches of the H bridge circuit that is coupled to a power source and is connected across a comparator is a high ohmic switch.

14. The crystal oscillator circuit of claim 10, wherein the plurality of switches is a plurality of non-zero on-resistance switches, such that a measured voltage over a switch in an 'on' state indicates a measure of a current flowing through it.

15. The crystal oscillator circuit of claim 9 wherein each respective switch of the plurality of switches of the H bridge circuit that is coupled to a power source and is connected across a comparator is a high ohmic switch.

16. The crystal oscillator circuit of claim 15 wherein comparator inputs are alternately connected to a supply in order to detect a sign of an offset current monitored by the respective comparator.

17. The crystal oscillator circuit of claim 16 wherein the sign of the offset current is detected at a beginning of a start-up phase, and the sign is used to swap comparator inputs such that a comparator offset is always negative.

18. The crystal oscillator circuit of preceding claim 9, wherein the plurality of switches is a plurality of non-zero on-resistance switches, such that a measured voltage over a switch in an 'on' state indicates a measure of a current flowing through it.

19. The crystal oscillator circuit of claim 18, wherein, a measure of a current flowing through the switch indicates a zero-crossing point of the motional current $I_m$.

20. A method for operating a crystal oscillator circuit comprising:
applying a voltage step across a crystal resonator by a voltage source;
determining a polarity of the voltage source in response to the determined sign of the current passing through the crystal resonator;
applying a self-timed energy injection waveform to the crystal resonator; and
switching the self-timed energy injection waveform in response to the determined sign of the current, wherein the injection waveform switches polarity at each zero-crossing of a motional branch current of the crystal resonator.

* * * * *